United States Patent
Kato et al.

(10) Patent No.: US 7,341,678 B2
(45) Date of Patent: Mar. 11, 2008

(54) CHARGE-TRANSPORTING VARNISH

(75) Inventors: Taku Kato, Funabashi (JP); Go Ono, Funabashi (JP); Takuji Yoshimoto, Funabashi (JP)

(73) Assignee: Nissan Chemical Industries, Ltd., Tokyo (JP)

( * ) Notice: Subject to any disclaimer, the term of this patent is extended or adjusted under 35 U.S.C. 154(b) by 60 days.

(21) Appl. No.: 10/557,177

(22) PCT Filed: May 19, 2004

(86) PCT No.: PCT/JP2004/007118

§ 371 (c)(1),
(2), (4) Date: Nov. 17, 2005

(87) PCT Pub. No.: WO2004/105446

PCT Pub. Date: Dec. 2, 2004

(65) Prior Publication Data

US 2006/0225611 A1 Oct. 12, 2006

(30) Foreign Application Priority Data

May 20, 2003 (JP) .............................. 2003-141975

(51) Int. Cl.
*H01B 1/12* (2006.01)
*C09K 11/06* (2006.01)

(52) U.S. Cl. .................. 252/500; 252/301.16

(58) Field of Classification Search ........... 252/500, 252/301.16
See application file for complete search history.

(56) References Cited

FOREIGN PATENT DOCUMENTS

| JP | 2000-44683 A | 2/2000 |
|---|---|---|
| JP | 2002-151272 A | 5/2002 |
| JP | 2002-151272 A * | 5/2002 |

OTHER PUBLICATIONS

Junbo Gao et al., 'Chemical Oxidation and Electrochemical Oxidatino on Phenyl-Capped Oligoanilines', Polymer Preprints, Aug. 1999, vol. 40, No. 2, p. 815.

C. W. Tang et al., Applied Physics Letters. vol. 51, (12), Sep. 21, 1987, pp. 913-915.
J. H. Burroughes et al., Nature, vol. 347, Oct. 11, 1990, pp. 539-541.
S. A. Van Slyke et al., Applied Physic Letters, vol. 69, (15), Oct. 7, 1996, pp. 2160-2162.
G. Gustafsson et al., Nature, vol. 357, Jun. 11, 1992, pp. 477-479.
Y. Yang et al., Applied Physics Letters, vol. 64, (10), Mar. 7, 1994, pp. 1245-1247.
Jayesh Bharathan et al., Applied Physics Letters, vol. 72, No. 21, May 25, 1998, pp. 2660-2662.
Takeo Wakimoto et al., IEEE Transactions on Electron Devices, vol. 44, No. 8, Aug. 1997, pp. 1245-1248.
L.S. Hung et al., Applied Physics Letters, vol. 70, (2) Jan. 13, 1997, pp. 152-154.
Chimed Ganzorig et al., Japanese Journal of Applied Physics, vol. 38 (1999) pp. L1348-1350.

* cited by examiner

*Primary Examiner*—David M Brunsman
(74) *Attorney, Agent, or Firm*—Birch, Stewart, Kolasch & Birch, LLP (57) ABSTRACT

A charge-transporting varnish is disclosed which comprises a charge-transporting material composed of an oligoaniline compound represented by the formula (1) below and at least one kind of solvent. In this charge-transporting varnish, the charge-transporting material is dissolved or homogeneously dispersed in the solvent. By using this varnish, a charge-transporting thin film having excellent conductive characteristics can be formed through a short-time firing. In particular, when the varnish is applied to an OLED element or a PLED element, the resulting element can achieve excellent element characteristics such as low driving voltage, high luminous efficiency and long life

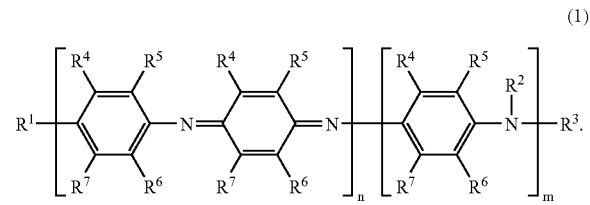

(1)

8 Claims, 2 Drawing Sheets

CHARGE-TRANSPORTING VARNISH

This application is a 371 filing of PCT/JP04/07118, filed 19 May 2004.

TECHNICAL FIELD

This invention relates to a charge-transporting varnish and, more particularly, to a charge-transporting varnish capable of forming, for example, a charge transporting thin film which is able to improve electric characteristics and life characteristic while preventing concentration phenomena of electric current and charge. This charge-transporting varnish is applicable as an organic electroluminescent (hereinafter referred to as EL) element, a capacitor element, an antistatic film and the like.

BACKGROUND ART

Organic EL elements, particularly, low molecular weight organic EL (hereinafter referred to as OLED), have been isolated function thereof by Eastman Kodak based on ultrathinning and multilayering of organic layers and are thus remarkably improved in characteristics such as drastic lowering of drive voltage (Applied Physics Letters, U.S.A., 1987, Vol. 51, pp. 913-915). Cambridge University found an EL element using a polymeric fluorescent material (hereinafter referred to as PLED) (Nature, England, 1990, Vol. 347, pp. 539-541), which has now been improved in characteristics to such a level as to compare with conventional OLED elements.

On the other hand, it was found that with OLED elements, provision of a copper phthalocyanine (CuPC) layer as a hole injection layer leads to an improvement in initial characteristics such as low drive voltage and high luminous efficiency and an effect of prolonging the life of the elements (Applied Physic Letters, U.S.A., 1996, Vol. 69, pp. 2160-2162). With PLED elements, it has been shown that similar effects are obtained using, as a hole transporting layer (buffer layer), polyaniline materials (Nature, England, 1992, Vol. 357, pp. 477-479, Applied Physics Letters, U.S.A., 1994, Vol. 64, pp. 1245-1247), and polythiophene materials (Applied Physics Letters, U.S.A., 1998, Vol. 72, pp. 2660-2662). At a cathode side, it has been found that initial characteristics could be improved using, as an electron injection layer, metal oxides (IEEE Transactions on Electron Devices, U.S.A., 1997, Vol. 44, pp. 1245-1248), metal halides (Applied Physics Letters, U.S.A., 1997, Vol. 70, pp. 152-154), and metal complexes (Japanese Journal of Applied Physics, 1999, Vol. 38, pp. L1348-1350). These electron layer and buffer layer have been now in general use.

However, CuPC that has been ordinarily used as a hole injection material in OLED element has the drawback that it has drastic irregularities and thus, brings about a great characteristic lowering upon mixing in other organic layers in small amount. Polyaniline-type materials and polythiophene-type materials currently employed for PLED element involve problems in that they contain, as a solvent, water having capability of promoting element deterioration, limitation is placed on the choice of solvent, limitation is also placed on the manner of coating ensuring uniform film formation because of coagulation of material and low solubility, and a difficulty is involved in control of viscosity.

Based on the facts set out hereinabove, organic solvent-based charge transporting varnishes using low molecular weight oligoaniline materials have been recently found. It has been found that insertion of a hole injection layer obtained by use of this type of material enables excellent EL element characteristics to be shown (see JP-A 2002-151272).

In forming a charge transporting thin film from an oligoaniline compound, however, long-time firing at high temperature in the presence of oxygen is usually necessary. Thus, where low molecular weight oligoaniline materials are used as a hole injection layer in OLED element or PLED element, a prolonged time is required for the fabrication of the element, so that a problem has been indicated in the lowering of productivity. Hence, there is a demand for shortage of a firing time after the film formation.

DISCLOSURE OF INVENTION

An object of the invention is to provide a charge transporting varnish capable of achieving excellent conduction characteristics and obtained through firing within a short time in a system using an oligoaniline compound and a charge accepting dopant material.

As a result of intensive studies for achieving the above object, we have found that when using a charge transporting varnish obtained by dissolving or homogeneously dispersing, in a solvent, a charge transporting material being an oligoaniline compound of the following formula (1), a thin film having conduction characteristics that are as good as a conventional counterpart can be formed only by firing within a short time after film formation.

More particularly, the present invention provides the following inventions [1] to [8].

[1] A charge-transporting varnish, characterized by comprising a charge transporting substance being an oligoaniline compound represented by the formula (1) and at least one solvent, the charge transporting substance is dissolved or homogeneously dispersed in said solvent.

(1)

(wherein $R^1$ represents a hydrogen atom, an unsubstituted or substituted monovalent hydrocarbon group, an organooxy group, or an acyl group, $R^2$ and $R^3$ independently represent a hydrogen atom, an unsubstituted or substituted monovalent hydrocarbon group, or an acyl group, $R^4$ to $R^7$ independently represent a hydrogen atom, a hydroxyl group, an unsubstituted or substituted monovalent hydrocarbon group, an organooxy group, an acyl group, or a sulfonate group, m and n are independently an integer of 1 or over and satisfy $m+2n \leq 20$, and a quinoid moiety exists at an arbitrary position of the structural formula as tautomerized.)

[2] The charge-transporting varnish of [1], characterized in that the charge transporting substance is a product obtained by oxidizing an oligoaniline compound represented by the formula (2).

(2)

(wherein $R^1$ represents a hydrogen atom, an unsubstituted or substituted monovalent hydrocarbon group, an organooxy group, or an acyl group, $R^2$ and $R^3$ independently represent a hydrogen atom, an unsubstituted or substituted monovalent hydrocarbon group, or an acyl group, $R^4$ to $R^7$ independently represent a hydrogen atom, a hydroxyl group, an unsubstituted or substituted monovalent hydrocarbon group, an organooxy group, an acyl group, or a sulfonate group, and m and n are independently an integer of 1 or over and satisfy $m+2n \leq 20$.)

[3] The charge-transporting varnish of [1] or [2], characterized by further comprising a charge accepting dopant substance, the oxidized product and the charge accepting dopant being dissolved or homogeneously dispersed in said solvent.

[4] The charge-transporting varnish of [3], characterized in that the charge accepting dopant substance is a sulfonic acid derivative represented by the formula (3).

(3)

(wherein D represents a benzene ring, a naphthalene ring, an anthracene ring, a phenanthrene ring or a heterocyclic ring, and $R^8$ and $R^9$ independently represent a carboxyl group or a hydroxyl group.)

[5] An organic electroluminescent element obtained from the charge-transporting varnish of any one of [1] to [4].

[6] An organic electroluminescent element comprising a hole injection layer formed from the charge-transporting varnish of any one of [1] to [4].

[7] An organic electroluminescent element comprising a hole-transporting layer formed from the charge-transporting varnish of any one of [1] to [4].

[8] A charge transporting thin film formed from the charge-transporting varnish of any one of [1] to [4].

When using a charge transporting varnish of the invention, a charge transporting thin film can be obtained within a short time without lowering productivity according to a simple, inexpensive wet process. In this connection, the charge transporting varnish of the invention differs from a conventionally employed charge transporting varnish in the form of an aqueous solution, and can be used only by use of an organic solvent.

The formation of a charge transporting thin film of the invention on an electrode surface can prevent electric short-circuiting. The use of the charge transporting thin film as a charge injection layer of an organic EL element permits injection barrier to lower owing to the relaxation of ionization potentials of an electrode and an organic layer. In addition, application of conjugated oligomer groups to an organic EL element is enabled. From the foregoing, lowering of luminescence initiating voltage of an organic EL element, improvement of a current efficiency and prolonged life can be achieved.

Further, the charge transporting varnish of the invention is good with respect to thin film formation process and is useful for application to a capacitor electrode protection film and also to an antistatic film.

BEST MODE FOR CARRYING OUT THE INVENTION

The invention is described in more detail below.

The charge transporting varnish of the invention is one which contains a charge transporting material serving as a principal component for charge transporting mechanism and a solvent, or which contains a charge transporting material, a charge accepting dopant material for improving charge transportability and a solvent. In this case, the charge transporting material (and the charge accepting dopant material) are completely dissolved or homogeneously dispersed in the solvent.

The transportability used herein has the same meaning as conductivity and means any one of hole transportability, electron transportability, and transportability of both hole and electron. The charge transporting varnish of the invention may exhibit charge transportability in itself, or may exhibit charge transportability after conversion to a solid film obtained by use of the varnish.

The charge transporting material used in the present invention is an oligoaniline compound represented by the formula (1).

(1)

(wherein $R^1$ represents a hydrogen atom, an unsubstituted or substituted monovalent hydrocarbon group, an organooxy group, or an acyl group, $R^2$ and $R^3$ independently represent a hydrogen atom, an unsubstituted or substituted monovalent hydrocarbon group, or an acyl group, $R^4$ to $R^7$ independently represent a hydrogen atom, a hydroxyl group, an unsubstituted or substituted monovalent hydrocarbon group, an organooxy group, an acyl group, or a sulfonic acid group, m and n are independently an integer of 1 or over provided that $m+2n \leq 20$, and a quinoid moiety tautomerically exists at an arbitrary position of the structural formula.)

The substituent $R^1$ of the oligoaniline compound used in the invention is hydrogen, an unsubstituted or substituted monovalent hydrocarbon group, an organooxy group, or an acyl group, and $R^2$ and $R^3$ independently represent a hydrogen atom, an unsubstituted or substituted monovalent hydrocarbon group, or an acyl group.

The monovalent hydrocarbon group and the organooxy group should preferably have 1 to 20 carbon atoms, and the acyl group should preferably have 2 to 20 carbon atoms. The monovalent hydrocarbon group includes, for example, an alkyl group such as a methyl group, an ethyl group, a propyl group, a butyl group, a t-butyl group, a hexyl group, an octyl group, an decyl group or the like, a cycloalkyl group such as a cyclopentyl group, a cyclohexyl group or the like, a bicycloalkyl group such as a bicyclohexyl group or the like, an alkenyl group such as a vinyl group, a 1-propenyl group, a 2-propenyl group, an isopropenyl group, a 1-methyl-2-propenyl group, a 1, 2 or 3-butenyl group, a hexenyl group or the like, an aryl group such as a phenyl group, a xylyl group, a tolyl group, a biphenyl group, a naphthyl group or the like, an aralkyl group such as a benzyl group, a phenylethyl group, a phenylcyclohexyl group or the like, or a group wherein part or all of the hydrogen atoms of these monovalent hydrocarbon groups are substituted with a halogen atom, a hydroxyl group, an alkoxy group or the like.

As an organooxy group includes an alkoxy group, an alkenyloxy group, an aryloxy group or the like. For these alkyl group, alkenyl group and aryl group, mention is made of such groups as exemplified above.

The acyl group includes one having 2 to 10 carbon atoms such as, for example, an acetyl group, a propionyl group, a butyryl group, an isobutyryl group, a valeryl group, an isovaleryl group, a benzyl group or the like.

Preferred examples of $R^1$ and $R^2$ include a hydrogen atom, an alkyl group having 1 to 20 carbon atoms, preferably 1 to 4 carbon atoms, a phenyl group, a cyclohexyl group, a cyclopentyl group, a biphenyl group, a bicyclohexyl group or a phenylcyclohexyl group (provided these phenyl, cyclohexyl, cyclopentyl, biphenyl, bicyclohexyl and phenylcyclohexyl groups may have a substituent such as an alkyl group or an alkoxy group having 1 to 4 carbon atoms.), or an acyl group having 2 to 4 carbon atoms. For $R^3$, a hydrogen atom, an alkyl group having 1 to 4 carbon atoms, or a phenyl group which may have an alkoxy group as a substituent is preferred.

Especially, the case where $R^1$ is a hydrogen atom and $R^3$ is a phenyl group, i.e., the oligoaniline compound of the formula (1) is blocked with a phenyl group at both ends thereof, is preferred.

The substituents $R^4$ to $R^7$ independently represent a hydrogen atom, a hydroxyl group, an unsubstituted or substituted monovalent hydrocarbon group, an organooxy group, an acyl group, and a sulfonic acid group. The unsubstituted or substituted monovalent hydrocarbon group and organooxy group should preferably have 2 to 20 carbon atoms, respectively, and the acyl group should preferably have 2 to 20 carbon atoms, and mention may be made of those groups as indicated with respect to $R^1$.

The substituents $R^4$ to $R^7$ preferably include a hydrogen atom, an alkyl group, an alkoxy group, an alkoxyalkyl group, an alkenyl group, an acyl group, a sulfonic acid group, and a hydroxyl group, or a phenyl group, a cyclohexyl group, a cyclopentyl group, a biphenyl group, a bicyclohexyl group or a phenylcyclohexyl group that may have a substituent of an alkyl group or alkoxy group each having 1 to 4 carbon atoms.

More preferably, $R^4$ to $R^7$ represents a hydrogen atom, an alkyl group having 1 to 20 carbon atoms, an alkoxy group having 1 to 20 carbon atoms, an alkoxyalkyl group wherein the alkoxy group has 1 to 20 carbon atoms and the alkyl group has 1 to 20 carbon atoms, an alkenyl group having 2 to 4 carbon atoms, an acyl group having 2 to 4 carbon atoms, a benzoyl group, a sulfonic acid group, a hydroxyl group, or a phenyl group, a cyclohexyl group, a cyclopentyl group, a biphenyl group, a bicyclohexyl group or a phenylcyclohexyl group that may have a substituent (wherein the substituent includes an alkyl group having 1 to 4 carbon atoms or an alkoxy group having 1 to 4 carbon atoms), respectively. Most preferably, mention is made of a hydrogen atom, an alkyl group having 1 to 4 carbon atoms, an alkoxy group having 1 to 4 carbon atoms, an alkoxyalkyl group wherein the alkoxy group has 1 to 4 carbon atoms and the alkyl group has 1 to 4 carbon atom, a vinyl group, a 2-propenyl group, an acetyl group, a benzoyl group, a sulfonic acid group, a hydroxyl group, or a phenyl group, a cyclohexyl group, a biphenyl group, a bicyclohexyl group or a phenylcyclohexyl group that may have a substituent (wherein the substituent includes an alkyl group having 1 to 4 carbon atoms or an alkoxy group having 1 to 4 carbon atoms), respectively. It will be noted that in the two benzene rings of the formula (1), the substituents indicated by the same symbol may be the same or different.

The numbers of m and n at the oligoaniline moiety are independently an integer of 1 or over. It is preferred that a ratio of m to n is 2 or over. Where solubility in a solvent for charge transporting material is taken into account, m+2n should preferably be 20 or below. Where a solution having a high concentration of 20 wt % or over is prepared, a value of 10 or below, preferably 5 or below is preferred.

The charge transporting material of the formula (1) can be obtained by oxidizing an oligoaniline compound of the formula (2).

(wherein $R^1$ to $R^7$, m and n are, respectively, the same as defined hereinbefore.)

When taking enhanced solubility and uniform charge transportability into account, the oligoaniline compound represented by the formula (2) should preferably one which has no distribution of molecular weight, i.e., a degree of dispersion is at 1.

Specific examples of such an oligoaniline compound are those oligoaniline compounds soluble in organic solvents, such as phenyltetraaniline, phenylpentaaniline and the like. With respect to the synthesis of this type of oligoaniline compound, mention is made of synthetic processes set forth, for example, in Bulletin of Chemical Society of Japan, 1994, Vol. 67, pp. 1749-1752) and Synthetic Metals, U.S.A., 1997, Vol. 84, pp. 119-120) although not limited to these ones.

The oxidation treatment carried out for the oligoaniline compound of the formula (2) is performed by a procedure wherein after dissolving the oligoaniline compound in an appropriate solvent, for example, chemical oxidation is carried out by use of an appropriate oxidizing agent, or wherein while heating a powder or solution of the oligoaniline compound, oxidation is carried out in air or in the presence of oxygen under stirring, although not limited to these procedures.

For the solvent used for carrying out the oxidation treatment, although mention is made specifically of N,N-dimethylformamide, N,N-dimethylacetamide, N-methylpyrrolidone, N,N'-dimethylimidazolidinone, dimethylsulfoxide, chloroform, tetrahydrofuran, 1,4-dioxane, toluene, xylene and the like, no limitation is placed so far as those capable of dissolving the oligoaniline are used. These may be used singly or in admixture.

Specific examples of an oxidizing agent used for carrying out the oxidation treatment include a halogen such as chlorine, bromine, iodine or the like, an inorganic acid such as nitric acid, sulfuric acid or the like, an inorganic oxidizing agent such as ozone, hydrogen peroxide, potassium permanganate, potassium dichromate, sulfur dioxide and the like, and organic oxidizing agent such as 7,7,8,8-tetacyaoquinodimethane (TCNQ) and derivatives thereof, 1,1,2,2-tetracyanoethylene (TCNE), 2,3-dichloro-5,6-dicyano-1,4-enzoquinone (DDQ), chloranil and bromanil although not limited to these compounds.

As the charge accepting dopant material used in the invention, an electron accepting dopant material is used for a hole transporting material and a hole accepting dopant material is used for an electron transporting material, and both should favorably have high charge receptivity. As to solubility, no limitation is placed so far as those materials capable of being dissolved in at least one solvent are used.

Specific examples of the electron accepting dopant include inorganic strong acids such as hydrogen chloride, sulfuric acid, nitric acid and phosphoric acid, Lewis acids such as aluminium (III) chloride ($AlCl_3$), titanium (IV) tetrachioride ($TiCl_4$), boron tribromide ($BBr_3$), borontrifluoride complex ($BF_3OEt_2$), iron (III) chloride ($FeCl_3$), copper (II) chloride ($CuCl_2$), antimony pentachioride ($SbCl_5$), arsenic (V) pentafluoride ($AsF_5$), phosphorus pentafluoride ($PF_5$), tri(4-bromophenyl)aluminium hexachloroantmonate ((TBPAH) and the like, organic strong acids such as benzenesulfonic acid, tosyl acid, camphorsulfonic acid, hydroxybenzensulfonic acid, 5-sulfosalicylic acid, dodecylbenzenesulfonic acid, polystyrenesulfonic acid and the like, and organic or inorganic oxidizing agents such as TCNQ and derivatives thereof, DDQ and iodine although not limited to these compounds.

Specific examples of the hole accepting dopants include alkali metals (Li, Na, K, Cs) and metal complexes such as lithium quinolinoate (Liq) and lithium acetylacetonate (Li (acac)), and the like although not limited to these dopants. Both of the charge transporting material and charge accepting dopant material should preferably be in the form of an amorphous solid. If either or both are not in the form of an amorphous solid, it has found as a result of combination of both the charge transporting material and charge accepting dopant substance and a solvent indicated hereinafter that materials capable of exhibiting an amorphous solid property after film formation are preferred. Where either or both of the charge transporting material and charge accepting dopant material are in the form of a crystalline solid, at least one of the materials should preferably have random intermolecular interaction. With a low molecular weight compound, those materials having, for example, three or more different polar functional groups in the same molecule are favorable. Although not limitative, such compounds include, for example, Tiron, dihydroxybenzenesulfonic acid and sulfonic acid derivatives represented by the formula (3) and the like. Of these, the sulfonic acid derivatives represented by the formula (3) are preferred. Specific examples of the sulfonic acid derivative include sulfosalicyclic acid derivatives, e.g., 5-sulfosalicyclic acid and the like.

(3)

(wherein D represents a benzene ring, a naphthalene ring, an anthracene ring, a phenanthrene ring or a heterocyclic ring, and $R^8$ and $R^9$ independently represent a carboxyl group or a hydroxyl group.)

The solvent used for obtaining the charge transporting varnish of the invention is not critical provided that it is able to dissolve a charge transporting material having been subjected to oxidation treatment, and it is preferred that the varnish is in a state where completely dissolved or homogeneously dispersed. Specific examples of the solvents include water, methanol, N,N-dimethylformamide, N,N-dimethylacetamide, N-methylpyrrolidone, N,N'-dimethylimidazolidinone, dimethylsulfoxide, chloroform, toluene, methanol and the like solvent. These may be used singly or in admixture.

A highly viscous solvent may be mixed for the purpose of obtaining a varnish having high viscosity within a range of not impeding solubility. Specific examples include cyclohexanol, ethylene glycol, ethylene glycol diglycidyl ether, 1,3-octylene glycol, diethylene glycol, dipropylene glycol, triethylene glycol, tripropylene glycol, 1,3-butandiol, 1,4-butandiol, propylene glycol, hexylene glycol and the like although not limited to these solvents.

Further, solvents for imparting flatness to a film upon firing for the purposes of improving wettability against a substrate, control in surface tension of a solvent, control of polarity, control of a boiling point and the like may be used for the varnish within a range of not impeding solubility. Specific examples include butyl cellosolve, diethylene glycol diethyl ether, dipropylene glycol monomethyl ether, ethyl carbitol, diacetone alcohol, γ-butyrolactone, ethyl lactate and the like although not limited to these.

A concentration of a charge transporting material in a solution can be controlled within the range of 1 to 80 wt %, particularly 1 to 20 wt %.

A charge transporting film can be formed on a substrate by coating the charge transporting varnish onto the substrate and evaporating the solvent. Although the manner of coating is not limitative, there are mentioned, for example, a dipping method, a spin coating method, a transferring printing method, a roll coating method, an ink jet method, a spraying method, a brushing method and the like. Although the manner of evaporation of solvent is not critical, it is possible to carry out evaporation by use of a hot plate or an oven in an appropriate atmosphere, i.e., in air or an inert gas such as nitrogen or the like, or in vacuum. The firing temperature is not critical so far as a solvent can be evaporated and is preferably within 40 to 250° C. To ensure more uniform film formation or to cause the reaction on the substrate to proceed, a temperature may be changed in two or more stages.

With respect to the charge transporting thin film obtained by the coating and evaporation procedures, the film thickness is not critical, and preferably ranges 5 to 200 nm where used as a charge injection layer of an organic EL element. For a method of changing the film thickness, mention is made of a method wherein a solid content in a varnish is changed, a method of changing an amount of solution on application to a substrate, and the like.

The procedure of making an OLED element using the charge transporting varnish of the invention and the types of materials used may be those described hereinbelow although not limited thereto.

It is preferred that the electrode substrate used has been cleaned beforehand through washing with a liquid such as a detergent, an alcohol, pure water or the like, and with an anode substrate, a surface treatment such as an ozone treatment, an oxygen-plasma treatment or the like is carried out immediately before use. It is to be noted that where an anodic material is made principally of an organic matter, the surface treatment may not be performed.

Where a hole transporting varnish is used for an OLED element, the following procedure is used.

The hole transporting varnish is applied onto an anode substrate according to such a method as set out above to form a hole transporting thin film on the electrode. The substrate is placed into a vacuum evaporation apparatus, followed by successive vacuum deposition of a hole transporting layer, a luminescent layer, an electron transporting layer, an electron injection layer and a cathodic metal to provide an OLED element. For controlling a luminescent region, a carrier block layer may be provided between arbitrary layers.

Mention is made, as an anodic material, transparent electrodes typical of which are indium tin oxide (ITO) and indium zinc oxide (IZO), and it is preferred to use those subjected to planarization. Alternatively, polythiophene derivatives and polyanilines having high charge transportability may also be used. For materials forming a hole transporting layer, there are mentioned triarylamines such as (triphenylamine) dimer derivative (TPD), ($\alpha$-naphthyldiphenylamine) dimer ($\alpha$-NPD), [(triphenylamine)dimer] spirodimer (spiro-TAD) and the like, starburst amines such as 4,4',4''-tris[3-methylphenyl(phenyl)-amino]triphenylamine (m-MTDATA), 4,4',4''-tris[1-naphthyl-(phenyl)amino]triphenylamine (1-TNATA) and the like, and oligothiophenes such as 5,5''-bis-{4-[bis(4-methylphenyl)-amino]phenyl}-2,2':5',2''terthiophene (BMA-3T) and the like.

For the material forming a luminescent layer, mention is made of tris(8-quinolinolate) aluminium (III) ($Alq_3$), bis(8-quinolinolate) zinc (II) ($Znq_2$), bis(2-methyl-8-quinolinolate) (p-phenylphenolate) aluminium (III) (BAlq), 4,4'-bis(2,2-diphenylvinyl)biphenyl (DPVBi) and the like. The luminescent layer may be formed by co-deposition of an electron transporting material or a hole transporting material and a luminescent dopant.

For an electron transporting material, mention is made of $Alq_3$, BAlq, DPVBi, (2-(4-biphenyl)-5-(4-t-butylphenyl)-1,3,4-oxadiazole) (PBD), triazole derivatives (TAZ), baxoproin (BCP), syrol derivatives and the like.

For a luminescent dopant, mention is made of quinacridone, rubrene, coumarin 540, 4-(dicyanomethylene)-2-methyl-6-(p-dimethylaminostyryl)-4H-pyran (DCM), tris(2-phenylpyridine) iridium (III) ($Ir(ppy)_3$), (1,10-phenanthoroline)-tris(4,4,4-trifluoro-1-(2-thienyl)-butan-1,3-dionate)europium (III) ($Eu(TTA)_3phen$) and the like.

For a material forming a carrier block layer, PBD, TAZ and BCP are mentioned.

For an electron injection layer, mention is made of lithium oxide ($Li_2O$), magnesium oxide (MgO), alumina ($Al_2O_3$), lithium fluoride (LiF), magnesium fluoride ($MgF_2$), strontium fluoride ($SrF_2$), Liq, Li(acac), lithium acetate, lithium benzoate and the like.

Aluminium, magnesium-silver alloys, aluminium-lithium alloys, lithium, sodium, potassium, cesium and the like are mentioned as a cathodic material.

With the case where the charge transporting varnish of the invention is used as an OLED element, the following procedure is employed.

The electron transporting varnish is used to form an electron transporting thin film on an anode substrate and is placed into a vacuum deposition apparatus, and an electron transporting layer, a luminescent layer, a hole transporting layer and a hole injection layer are formed, followed by film formation of an anodic material a method such as sputtering to provide an OLED element.

Although the manner of making a PLED element using the charge transporting varnish of the invention is not critical, mention is made of the following procedure.

In the fabrication of the above OLED element, the vacuum deposition operations of the hole transporting layer, luminescent layer, electron transporting layer and electron injection layer are not carried out, but a luminescent charge transporting polymer layer is formed thereby making a PLED element including the charge transporting thin film formed of the charge transporting varnish of the present invention. More particularly, the hole transporting varnish is applied onto an anode substrate to form a charge transporting thin film on the electrode according to such a procedure as set out above, on which a luminescent charge transporting polymer layer is formed, followed by vacuum deposition of a cathode electrode to provide a PLED element. Alternatively, the electron transporting varnish is applied onto a cathode substrate to form an electron transporting thin film on the electrode according to such a procedure as set out above, followed by forming a luminescent charge transporting polymer layer thereon and forming an anode electrode by a procedure such as sputtering, vacuum deposition, spin coating or the like, thereby providing a PLED element.

The cathode and anode materials used are those substances as used for fabrication of the above OLED element. A washing treatment and a surface treatment in the fabrication of the OLED element can be applied to the fabrication of the PLED element.

For the formation of the luminescent charge transporting polymer layer, there is mentioned a method wherein a solvent is added to a luminescent charge transporting polymer material or its mixture with a luminescent dopant for dissolution or homogeneous dispersion, followed by coating onto an electrode substrate on which the hole injection layer has been formed, and evaporating the solvent to form a film.

For the luminescent charge transporting polymer materials, mention is made of polyfluorene derivatives such as poly(9,9-dialkylfluorene)(PDAF) and the like, polyphenylenevinylene derivatives such as poly(2-methoxy-5-(2'-ethylhexoxy)-1,4-phenylenevinylene) (MEH-PPV) and the like, polythiophene derivatives such as poly(3-alkylthiophene) (PAT) and the like, and polyvinylcarbazole (PVCz) and the like.

The solvents include toluene, xylene, chloroform and the like, and for dissolution or homogeneous dispersion, there are mentioned dissolution or homogeneous dispersion methods including stirring, stirring under heat, ultrasonic dispersion and the like.

The manner of coating is not critical and includes, for example, a dipping method, a spin coating method, a transferring printing method, a roll coating method, an ink jet method, a spraying method, a brushing method and the like. These coating methods is favorably carried out in an inert gas such as nitrogen, argon or the like.

For the evaporation of solvent, there is mentioned a method of heating in an inert gas or in vacuum with an oven or on a hot plate.

EXAMPLES

The invention is more particularly described by Examples and Comparative Examples, and the invention should not be construed as limited to the following Examples. It will be noted that "parts" in the following illustration means "parts by weight".

Example 1

Referring to the method described in Bulletin of Chemical Society of Japan, 1994, Vol. 67, pp. 1749-1752, phenylpentaaniline (PPA) represented by the formula (4) was obtained through the reaction between p-diaminodiphenylamine and p-hydroxydiphenylamine.

(4)

The synthesis of PPA was carried out according to the following procedure. That is, 1.00 g of p-diaminodiphenylamine was dissolved in 21 ml of toluene, to which 10.21 g of tetra-n-butoxy titanium serving as a dehydration condensing agent was added and dissolved. While the resulting reaction solution was maintained at 110° C. under a nitrogen atmosphere, 2.22 g of p-hydroxydiphenylamine dissolved in 42 ml of toluene was added to, followed by reaction at 110° C. under a nitrogen atmosphere for 48 hours. After completion of the reaction, the reaction solution cooled down to room temperature was filtered and the resulting filtrate was washed with toluene and then with diethyl ether and dried to obtain a light purple powder.

Figure 1:
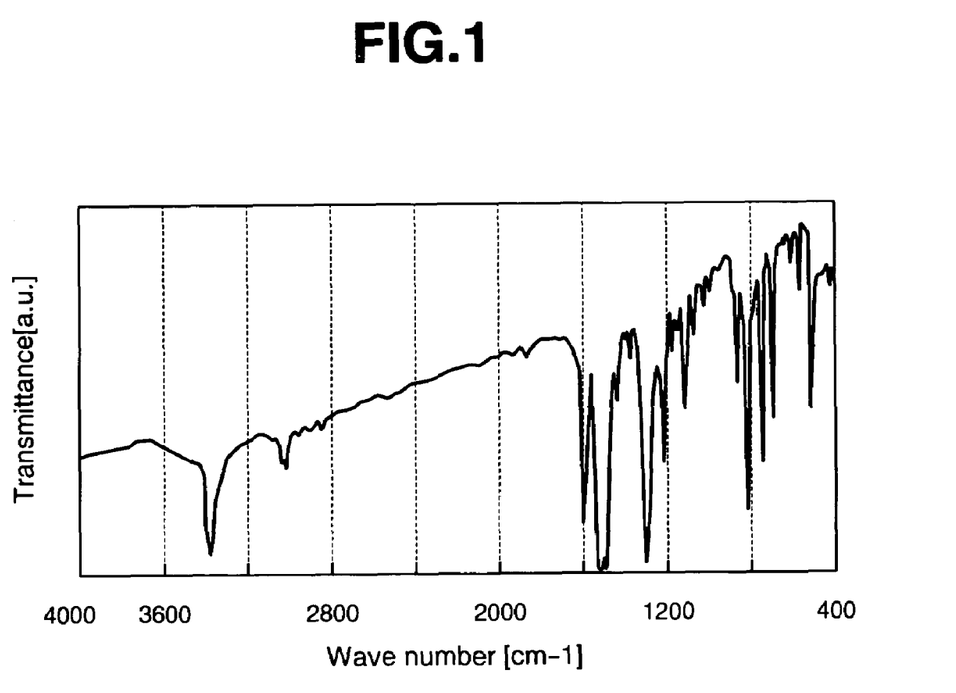
FIG. 1 is an infrared absorption spectral chart of phenylpentaaniline synthesized in Example 1.

The thus obtained powder was dissolved by adding 40 parts of dioxane and 0.2 equivalents of hydrazine hydrate thereto, purging the reaction system with nitrogen and heating under reflux. 16 parts of toluene was added to the resulting solution to suspend the solution, followed by heating under reflux and filtering the resulting solution in a hot condition. The solid precipitated from the filtrate was recrystallized, washed successively with toluene-dioxane (1:2.5) and ether under a nitrogen atmosphere, followed by collection through filtration and drying the resulting crystals under reduced pressure at 60° C. for 10 hours. Similar recrystallization operations were repeated once more to obtain 2.07 g (with a yield of 64%) of bluish purple crystals. The infrared absorption spectrum of the thus obtained PPA is shown in FIG. 1. The absorption attributed to the N—H stretch vibration was observed in the vicinity of 3400 cm$^{-1}$. In the mass spectrum (MALDI-TOF) of the PPA, a mass peak of m/z=533.18 corresponding to the molecular weight of PPA was observed.

The synthesized PPA was oxidized in the following way. That is, 1.00 g of PPA was dissolved in a mixed solvent of 300 ml of toluene and 50 ml of dioxane, followed by stirring at 110° C. in air for 48 hours to oxidize PPA. The resulting black liquid was filtered, and the solvent was distilled off from the filtrate to obtain 0.93 g (yield: 93%) of black powder.

Figure 2:
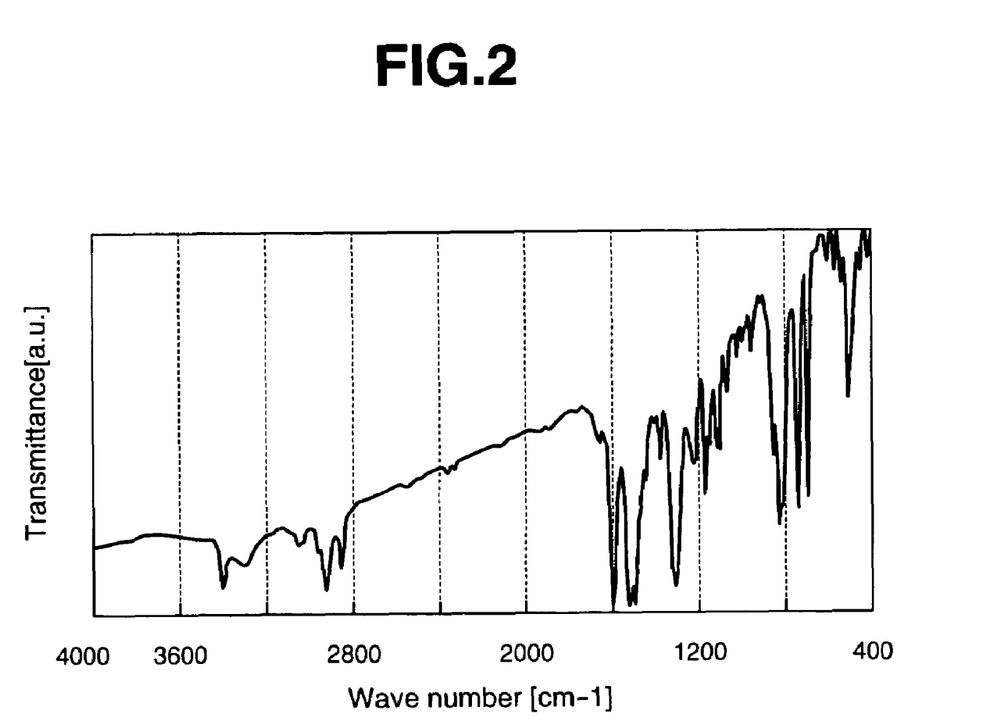
FIG. 2 is an infrared absorption spectral chart of oxidized phenylpentaaniline synthesized in Example 1.

The infrared absorption spectrum of the resulting oxidized PPA is shown in FIG. 2. The N—H stretch vibration at 3400 cm$^{-1}$ observed in FIG. 1 is reduced in intensity in FIG. 2. In the mass spectrum (MALD1-TOF) of the oxidized PPA, mass peaks of m/z=529.57 and m/z=531.59, which was smaller than the molecular weight of PPA, were observed. In view of this, it is considered that PPA is reliably oxidized by the above oxidation treatment.

0.43 g of 5-sulfosalicyclic acid and 2.8 g of N,N-dimethylacetamide (DMAc) were added to 0.18 g of the thus obtained, oxidized PPA under a nitrogen atmosphere and dissolved. 7.9 g of cyclohexanol was added to the resulting solution and stirred to provide a varnish (solid content: 4.2%). The thin film formation of the resulting varnish on an ITO glass substrate was carried out in the following way. An ozone treatment is carried out for 40 minutes on the ITO glass substrate immediately before a spin coating on the varnish. More particularly, the varnish was coated on the substrate according to a spin coating method and fired in air at 160° C. and 180° C. to form a 30 nm thick thin film. The firing temperature and firing time in the course of film formation, and electric conductivity at room temperature are shown in Table 1.

TABLE 1

| Run No. | Firing temperature (° C.) | Firing time (minutes) | Electric conductivity [S/cm] (under current application of 100 mA/cm$^2$) |
|---|---|---|---|
| 1 | 180 | 1 | 3.82 × 10$^{-7}$ |
| 2 | 180 | 3 | 5.20 × 10$^{-7}$ |
| 3 | 180 | 5 | 6.19 × 10$^{-7}$ |
| 4 | 180 | 10 | 6.16 × 10$^{-7}$ |
| 5 | 180 | 20 | 6.29 × 10$^{-7}$ |
| 6 | 180 | 30 | 6.62 × 10$^{-7}$ |
| 7 | 180 | 60 | 6.72 × 10$^{-7}$ |
| 8 | 180 | 120 | 7.03 × 10$^{-7}$ |
| 9 | 160 | 60 | 1.67 × 10$^{-7}$ |

Example 2

After formation of a hole transporting thin film on an ITO glass substrate according to the method set out in Example 1, the substrate was placed into a vacuum deposition apparatus, followed by vacuum deposition of α-NPD, Alq$_3$, LiF and Al successively. The film thicknesses were, respectively, set at 40 nm, 60 nm, 0.5 nm and 100 nm, and the vacuum deposition operations were, respectively, carried out after a pressure was at 8×10$^{-4}$ Pa or below. The deposition rate was 0.3 to 0.4 nm/s except for LiF, and was 0.02 to 0.04 nm/s for LiF. The movement operations between the vacuum deposition operation cycles were performed in vacuum. The characteristics of the resulting OLED element are shown in Table 2.

TABLE 2

| | | | | At the time of luminescence of 500 cd/m$^2$ | |
|---|---|---|---|---|---|
| Run No. | Firing temperature (° C.) | Firing time (minutes) | Luminescence initiating voltage [V] | Voltage [V] | Current efficiency [CD/A] |
| 1 | 180 | 1 | 3.5 | 10.8 | 2.5 |
| 3 | 180 | 5 | 3.5 | 10.6 | 3.0 |
| 4 | 180 | 10 | 3.3 | 8.3 | 3.4 |
| 6 | 180 | 30 | 3.0 | 8.1 | 3.4 |
| 7 | 180 | 60 | 3.0 | 8.1 | 3.5 |
| 8 | 180 | 120 | 2.8 | 7.1 | 4.0 |
| 9 | 160 | 60 | 3.0 | 8.2 | 3.3 |

Comparative Example 1

5-Sulfosalicyclic acid (5-SSA), and N,N-dimethylacetamide (DMAc) and cyclohexanol were added to the PPA obtained after synthesis and purification carried by use of the method described in Example 1 to prepare a varnish.

An ITO glass substrate was subjected to ozone cleaning for 40 minutes immediately before spin coating of the varnish. The varnish was coated onto the ITO glass substrate according to the method set out in Example 1, followed by firing in air at 160° C. and 180° C. to provide a 30 nm thick thin film. The firing temperature and firing time in the course of film formation, and electric conductivity at room temperature are shown in Table 3. It will be seen that Example 1 ensures the formation of a thin film of higher electric conductivity by firing within a shorter time or at a lower temperature than Comparative Example 1.

TABLE 3

| Run No. | Firing temperature (° C.) | Firing time (minutes) | Electric conductivity [S/cm] (under current application of 100 mA/cm²) |
|---|---|---|---|
| 10 | 180 | 1 | $4.66 \times 10^{-8}$ |
| 11 | 180 | 3 | $7.79 \times 10^{-8}$ |
| 12 | 180 | 5 | $8.79 \times 10^{-8}$ |
| 13 | 180 | 10 | $1.02 \times 10^{-7}$ |
| 14 | 180 | 20 | $2.93 \times 10^{-7}$ |
| 15 | 180 | 30 | $3.99 \times 10^{-7}$ |
| 16 | 180 | 60 | $5.36 \times 10^{-7}$ |
| 17 | 180 | 120 | $6.98 \times 10^{-7}$ |
| 18 | 160 | 60 | $5.93 \times 10^{-8}$ |

Comparative Example 2

After formation on an ITO glass substrate as a hole transporting thin film by the method set out in Comparative Example 1, the substrate was placed into a vacuum deposition apparatus, followed by successive vacuum deposition of α-NPD, Alq₃, LiF and Al under the same conditions as in the method set out in Example 1. The characteristics of the resulting OLED element are shown in Table 4. Example 2 ensures the fabrication of an organic EL element with a higher luminescence initiating voltage and higher efficiency by firing within a shorter time or at a lower temperature than Comparative Example 2.

TABLE 4

| Run No. | Firing temperature (° C.) | Firing time (minutes) | Luminescence initiating voltage [V] | At the time of luminescence of 500 cd/m² | |
|---|---|---|---|---|---|
| | | | | Voltage [V] | Current efficiency [CD/A] |
| 10 | 180 | 1 | 5.0 | 14.3 | 2.1 |
| 12 | 180 | 5 | 4.5 | 13.2 | 2.3 |
| 13 | 180 | 10 | 4.5 | 10.6 | 2.4 |
| 15 | 180 | 30 | 3.5 | 8.6 | 3.1 |
| 16 | 180 | 60 | 3.0 | 8.4 | 3.5 |
| 17 | 180 | 120 | 3.0 | 8.4 | 4.0 |
| 18 | 160 | 60 | 4.0 | 8.7 | 3.1 |

The invention claimed is:

1. A charge-transporting varnish, comprising a charge transporting substance being an oligoaniline compound represented by the formula (1) and at least one solvent, the charge transporting substance is dissolved or homogeneously dispersed in said solvent;

wherein
R¹ represents a hydrogen atom, an unsubstituted or substituted monovalent hydrocarbon group, an organooxy group, or an acyl group,
R² and R³ independently represent a hydrogen atom, an unsubstituted or substituted monovalent hydrocarbon group, or an acyl group,
R⁴ to R⁷ independently represent a hydrogen atom, a hydroxyl group, an unsubstituted or substituted monovalent hydrocarbon group, an organooxy group, an acyl group, or a sulfonate group,
m and n are independently an integer of 1 or over and satisfy m+2n≦20, and
a quinoid moiety exists at an arbitrary position of the structural formula as tautomerized.

2. The charge-transporting varnish as set forth in claim 1, wherein the charge transporting substance is a product obtained by oxidizing an oligoaniline compound represented by the formula (2):

wherein
R¹ represents a hydrogen atom, an unsubstituted or substituted monovalent hydrocarbon group, an organooxy group, or an acyl group,
R² and R³ independently represent a hydrogen atom, an unsubstituted or substituted monovalent hydrocarbon group, or an acyl group,
R⁴ to R⁷ independently represent a hydrogen atom, a hydroxyl group, an unsubstituted or substituted monovalent hydrocarbon group, an organooxy group, an acyl group, or a sulfonate group, and
m and n are independently an integer of 1 or over and satisfy m+2n≦20.

3. The charge-transporting varnish as set forth in claim 1 or 2, further comprising a charge accepting dopant substance, the oxidized product and the charge accepting dopant being dissolved or homogeneously dispersed in said solvent.

4. The charge-transporting varnish as set forth in claim 3, wherein the charge accepting dopant substance is a sulfonic acid derivative represented by the formula (3):

(3)

wherein

D represents a benzene ring, a naphthalene ring, an anthracene ring, a phenanthrene ring or a heterocyclic ring, and $R^8$ and $R^9$ independently represent a carboxyl group or a hydroxly group.

5. An organic electroluminescent element obtained from the charge-transporting varnish as set forth in claim 1.

6. The organic electroluminescent element comprising a hole injection layer formed from the charge-transporting varnish as set forth in claim 1.

7. The organic electroluminescent element comprising a hole-transporting layer formed from the charge-transporting varnish as set forth in claim 1.

8. A charge transporting thin film formed from the charge-transporting varnish as set forth in claim 1.

* * * * *